United States Patent
Peterson et al.

(10) Patent No.: US 7,259,586 B2
(45) Date of Patent: Aug. 21, 2007

(54) CONFIGURABLE I/OS FOR MULTI-CHIP MODULES

(75) Inventors: Scott A. Peterson, Bloomington, MN (US); Donald T. McGrath, Fort Collins, CO (US); Scott C. Savage, Fort Collins, CO (US); Kenneth G. Richardson, Erie, CO (US)

(73) Assignee: LSI Corporation, Milpitas, CA (US)

( * ) Notice: Subject to any disclaimer, the term of this patent is extended or adjusted under 35 U.S.C. 154(b) by 161 days.

(21) Appl. No.: 11/115,561

(22) Filed: Apr. 27, 2005

(65) Prior Publication Data

US 2006/0244482 A1   Nov. 2, 2006

(51) Int. Cl.
*H03K 19/173* (2006.01)
(52) U.S. Cl. .............................. 326/38; 326/41; 326/63; 326/80
(58) Field of Classification Search .................. 326/38, 326/41
See application file for complete search history.

(56) References Cited

U.S. PATENT DOCUMENTS

| | | | |
|---|---|---|---|
| 6,344,758 B1 * | 2/2002 | Turner et al. ................. | 326/86 |
| 6,384,628 B1 * | 5/2002 | Lacey et al. .................. | 326/41 |
| 6,966,044 B2 * | 11/2005 | Reuland et al. ............... | 716/17 |
| 2004/0257882 A1 * | 12/2004 | Stackhouse et al. ... | 365/189.09 |
| 2006/0239052 A1 * | 10/2006 | McGrath et al. ............ | 363/147 |
| 2006/0253825 A1 * | 11/2006 | McGrath et al. ............. | 716/12 |
| 2006/0259841 A1 * | 11/2006 | Savage et al. .............. | 714/733 |

* cited by examiner

*Primary Examiner*—Vibol Tan
(74) *Attorney, Agent, or Firm*—Christopher P. Maiorana, PC

(57) ABSTRACT

An apparatus comprising an integrated circuit and a logic portion. The integrated circuit may have a plurality of regions each (i) pre-diffused and configured to be metal-programmed and (ii) configured to connect the integrated circuit to a socket. The logic portion may be implemented on the integrated circuit. The plurality of metal programmable regions are each (i) independently programmable and (ii) located in one of said pre-diffused regions. Each of the metal programmable regions comprises (a) a regulator section configured to generate an operating voltage from a common supply voltage, (b) a logic section configured to implement integrated circuit functions and operate at the operating voltage, and (c) a level shifter configured to shift the operating voltage to an external voltage level.

18 Claims, 2 Drawing Sheets

CONFIGURABLE I/OS FOR MULTI-CHIP MODULES

FIELD OF THE INVENTION

The present invention relates to an integrate circuit design generally and, more particularly, to a configurable I/Os for multi-chip integrated circuit modules.

BACKGROUND OF THE INVENTION

When application specific integrated circuits (ASICS) or Platform ASICs are implemented in multi-chip modules (MCM) there can be many supply voltages needed due to the mix of technology used. For example, when 90 nm and 0.13 micron technologies are used in the same package, multiple core and I/O voltages (i.e., 1.0, 1.2, or 1.5) are used. In addition, power is often wasted because I/Os typically are designed to drive package, electrostatic discharge protection circuitry (ESD) and board loads, which are much higher in capacitance than the load seen in an MCM.

Conventional solutions use multiple supply voltages and deal with unnecessary power dissipation on a case by case basis. However, providing multiple supply voltages can add cost to the system and complicate board design.

It would be desirable to implement configurable I/Os to operate with different supply voltages that may be used in multi-chip modules.

SUMMARY OF THE INVENTION

The present invention concerns an apparatus comprising an integrated circuit and a logic portion. The integrated circuit may have a plurality of regions each (i) pre-diffused and configured to be metal-programmed and (ii) configured to connect the integrated circuit to a socket. The logic portion may be implemented on the integrated circuit. The plurality of metal programmable regions are each (i) independently programmable and (ii) located in one of said pre-diffused regions. Each of the metal programmable regions comprises (a) a regulator section configured to generate an operating voltage from a common supply voltage, (b) a logic section configured to implement integrated circuit functions and operate at the operating voltage, and (c) a level shifter configured to shift the operating voltage to an external voltage level.

The objects, features and advantages of the present invention include providing a configurable I/O that may (i) provide voltage regulator in the configurable I/Os to reduce power supply voltages, (ii) implement level shifters and optimal drivers in configurable I/Os for optimal power and system performance, (iii) reduce the number of off-chip power supplies, and/or (iv) enable optimal power consumption.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
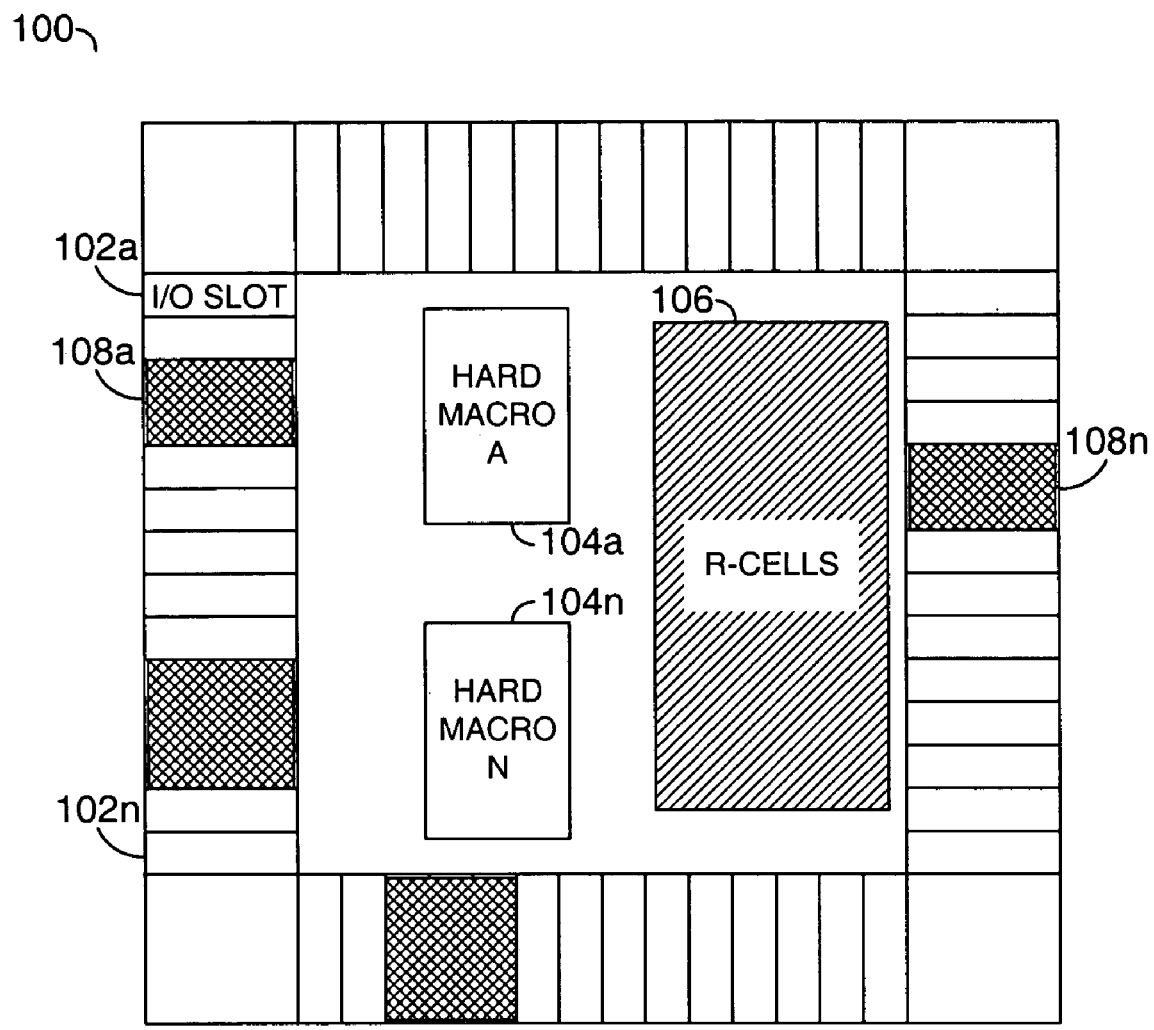
FIG. 1 is a block diagram of a platform application specific integrated circuit in accordance with a preferred embodiment of the present invention.

Referring to FIG. 1, a block diagram of a programmable platform device (or die, or slice) 100 is shown in accordance with one or more preferred embodiments of the present invention. The slice 100 may be implemented, in one example, as a partially manufactured semiconductor device in which all of the silicon layers have been fabricated (e.g., a first processing or pre-inventory phase), but where customization may be performed at a later time (e.g., a second processing or completed-inventory phase) via one or more metal layers.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice may be selected for customization at a later time because the particular IP blocks implemented are suitable for a customized application. By deferring the customization of the slice 100, a manufacturer may have the flexibility to keep an inventory of mostly complete slices 100 that may be used in a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

In one example, the slice 100 may comprise a number of regions 102, a number of regions 104, and one or more regions 106. The regions 102 may be implemented as configurable I/O slots (or CONFIGIOs) located around the periphery of the slice 100. The regions 104 may be implemented as one or more hard IP blocks (or hardmacros). The regions 106 may be implemented as one or more diffused regions. In one example, the diffused regions 106 may comprise an R-cell transistor fabric. The plurality of CONFIGIOs 102 may be distributed around a periphery of the slice 100. The regions 104 and 106 may be distributed around a core region of the slice 100.

In one example, the IP blocks 104 may be implemented similarly to an ASIC design. In general, the IP blocks 104 may be configured to provide a number of functions on the slice 100. For example, the IP blocks 104 may comprise phase locked loops (PLLs), instances of processors, input/output physical level (PHY) macros, etc. Soft and firm IP blocks may be implemented in the diffused region(s) 106.

The regions 106 may be customized, in one example, as logic and/or memory. For example, the regions 106 may be implemented as a sea of gates array. In one example, the regions 106 may be implemented as an R-cell transistor fabric comprising a number of R-cells. The term R-cell generally refers to an area of silicon designed (or diffused) to contain one or more transistors that have not yet been personalized (or configured) with metal layers. Wire layers may be added to the R-cells to make particular transistors, logic gates, soft and firm IP blocks and/or storage elements. For example, the programmable R-cells in the R-cell transistor fabric 106 may be customized to build non-diffused memories or other circuits for a particular application.

An R-cell generally comprises one or more diffusions for forming the parts of N and/or P type transistors and the contact points where wires may be attached in subsequent manufacturing steps (e.g., to power, ground, inputs and outputs). In general, the R-cells may be, in one example, building blocks for logic and/or storage elements. R-cells may be diffused in a regular pattern throughout a slice. For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

Prior to customization, the regions 102 may comprise generic pre-diffused regions that may provide a rich set of devices (e.g., transistors, resistors, capacitors, etc.). A number of different generic pre-diffused regions may be implemented (e.g., CONFIGIO1, CONFIGIO2, etc.). In one example, a number of types of transistors may be available (e.g., N and P, TO, ATO, HP, etc.). Examples of the types and numbers of devices that may be available in the regions 102 is summarized in the following TABLE 1:

TABLE 1

| ConfigIO2 | | ConfigIO1 | |
| --- | --- | --- | --- |
| Device Type | Number | Device Type | Number |
| pm_hp | 401 | pm_hp | 178 |
| pm_ato | 2048 | pm_ato | 470 |
| nm_ato | 129 | nm_to | 66 |
| nm_aton | 84 | nm_esd | 12 |
| nm_esd | 16 | resistors | 21 |
| nm_hp | 372 | | |
| nm_to | 1798 | | |
| resistors | 84 | | |

The devices provided in the regions 102 may be programmed by defining metal mask sets. Metal-metal capacitors (e.g., approximately one picofarad (pF) per slot) may be formed in the regions 102 where I/O power buses are absent. In one example, more than one of the regions 102 may be combined to implement more complex functions.

In one example, a multi-slot relocatable function 108 may be built using two or more metal mask sets. The metal mask sets may be placed over two or more of the generic pre-diffused regions 102 to form two or more sub-functions of the relocatable function 108. For any particular relocatable function 108, interconnects between the sub-functions may be implemented such that a place and route tool may be configured to run straight, orthogonal interconnections between the sub-functions. Straight, orthogonal interconnections generally minimize parasitics. The multi-slot functions in accordance with the present invention generally allow mixed-signal type or very sophisticated I/O functions to be defined and placed in the pre-defined, diffused I/O slots 102.

The multi-slot functions may be configured to provide mixed-signal functions using metal programmability. In general, the present invention allows mixed-signal functions to be constructed without any special diffused circuitry, special process options, and/or additional wafer cost. Because the mixed-signal functions implemented with multi-slot functions may be relocated to any I/O slot 102, pinout may be flexible. Examples of mixed-signal functions that may be implemented are summarized in the following TABLE 2:

TABLE 2

| Circuit | # of Slots | Applications | Function |
| --- | --- | --- | --- |
| PLL/DLL (500 MHZ range or less | 5-6 | Clock multipliers, clock-data deskew | Clock generation |
| Temperature Sensor (+/−10-15 degree C accuracy) | 2-3 | Cabinet design, package selection verification, system testing, reliability verification | Provides digital output proportional to die temperature |
| Voltage regulator | 1-3 | Any product that employs dual voltages | Generates 1.2 V, 1.8 V, or 2.5 V supply from 2.5 V or 3.3 V supply. May use external pass device. |
| Power On Reset (POR) | 1-2 | May be employed in any electronic product or system | Signals when I/O or core voltages are at valid levels |
| 8-10 bit, 1 Msps ADC | 3-5 | Tape/disc drive servos, MP3 players, digital cameras, wireless devices, fish finders, featurized phones, circuit breakers, process controllers | Sensor interface (temperature, touchpanel, battery monitor, vibration, humidity, position, other), RSSI, control systems |
| 12-14 bit, 20Ksps Sigma-delta ADC | 1-3 | Circuit breakers, power meters, instrumentation, voice encoders, motor diagnostics, medical devices, process controllers | Sensor interface (temperature, touchpanel, battery monitor, vibration, humidity, position, other) |
| 8-bit, 10Msps DAC | 2-3 | Motion control, process control, Tape/disc servos, digital trimming | Actuation and control |
| 32 Khz-50 Mhz | 2 | Any application where a | Generates a clock at a |

TABLE 2-continued

| Circuit | # of Slots | Applications | Function |
|---|---|---|---|
| Crystal Oscillator | | system clock is not always available: MP3 players, digital cameras, wireless devices, fish finders, featurized phones, circuit breakers | specified frequency set by the crystal |
| Filter (SC, CT) | 1-X | Tape read-channels, voice encoders, instrumentation, circuit breakers | Conditions as analog signals |

Other building block circuits that may be implemented to accomplish custom analog functions may include, but are not limited to, operational amplifiers, comparators, analog multiplexers, analog switches, voltage/current reference. The region 104 may also be used to implement mixed-signal functions (e.g., switched capacitor filters, gm/C filters, data converters, etc.).

The present invention may be implemented in a platform ASIC used in a multi-chip module (MCM). A multi-chip module may be implemented as a plurality of dies. One or more voltage regulators may be designed into the Platform ASIC in one or more configurable I/Os. The regulators step up (or down) one or more supply voltages and generate a plurality of operating voltages used in the MCM. In addition, the configurable I/Os may be tailored to meet the drive needs in the MCM, thus providing an optimal solution with respect to power consumption. One or more level shifters may also be incorporated in the configurable I/Os for optimal signal levels between chips in the MCM. Having tailored drive levels may reduce power consumption and/or increase system performance.

The present invention may be implemented in multi-chip modules, multiple platform ASICS, hybrids, etc. The present invention may (i) implement supplies of various chips in a common package, (ii) regulate the power consumption of such chips, and/or (iii) provide a communication mechanism of the chips. The present invention proposes using metal programmable transistors in the IOs of each of the chips to create regulators, level shifters, transmitters, receivers, and/or minimal-power consumption ESD (electrostatic discharge) protection functions. Such functions may allow a multi-chip module to be implemented using fewer board components, having lower power dissipation, and/or with lower cost to the user.

Figure 2:
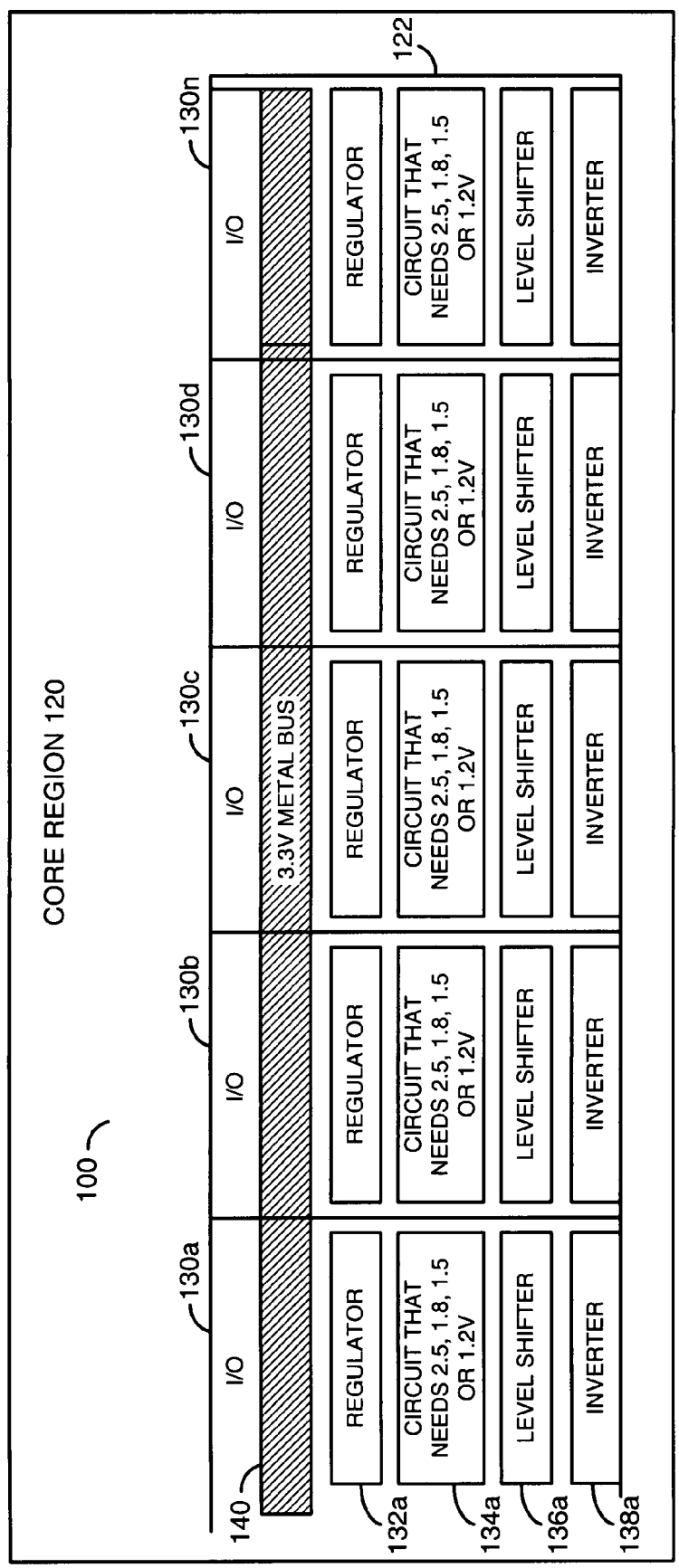
FIG. 2 is a block diagram illustrating a number of I/O slots in accordance with a preferred embodiment of the present invention.

Referring to FIG. 2, a diagram illustrating the top view of a portion of the chip 100 is shown. A core region 120 is shown on top and an IO region 122 is shown on the bottom. The IO region 122 generally comprises a number of IOs 130*a*-130*n*, where n is an integer. The IOs 130*a*-130*n* generally correspond to the IO slots 102*a*-102*n* of FIG. 1. Each of the IOs 130*a*-130*n* contains a number of components. For example, the IO 130*a* generally comprises a regulator block (or circuit) 132*a*, a circuit block 134*a*, a level shifter block (or circuit) 136*a*, and an inverter block (or circuit) 138*a*. The IOs 130*b*-130*n* contain similar components. Additional components, such as transmitters, receivers, electrostatic discharge protection devices, may also be implemented.

Each of the individual IOs 130*a*-130*n* generally contains a voltage regulator 132*a*-132*n* that may be used to generate additional voltages that may be lower than a supply voltage (e.g., VDD). The supply voltage VDD may be generated on a metal bus 140. The metal bus 140 may be configured to span each of the IOs 130*a*-130*n*. A typical supply voltage VDD may be 3.3 v. However, the circuitry 134*a*-134*n* in a particular IO 130*a*-130*n* may run on 2.5 v, 1.8 v, 1.5 v, 1.2 v, etc. Additionally, a number of different physical silicon pieces may be implemented inside the package cavity region. The multiple pieces may be fabricated using a similar technology (e.g., all with 90 nm technology) or with multiple technologies (e.g., with 90 nm, 0.13 um, 0.25 um, or other technologies). Each of the different pieces and/or technologies may operate at the same voltage or at a different voltage. Different technologies may be used to accommodate different IP blocks that may each only be available in a particular technology.

The additional voltages may be operating voltages generated using the 3.3 v supply voltage VDD and the regulators 132*a*-132*n*. A single supply voltage VDD may be used to route the 3.3 v to each of the IOs 130*a*-132*n*. The regulators 132*a*-132*n* may be used to reduce and/or eliminate the need for offchip regulators (expensive in regulator cost and board cost) to create 2.5 v, 1.8 v, 1.5 v, 1.2 v, etc. Reducing and/or eliminating off chip regulators also reduces and/or eliminates extra pins to bring such voltages on chip. While a single metal bus 140 is shown, one or more additional buses may be implemented. In such an example, each of the metal buses may be used, independently or in combination, to generate a number of operating voltages.

The level shifters 136*a*-136*n* may be implemented to translate digital signals between supply domains. For example, the core region 120 may swing between 0 and 1.2 v when presenting on-chip signals, such as a clock signal. However, when sending signals off chip, a clock signal typically swings between 0 and 2.5 v-3.3 v. The level shifter 136*a*-136*n* may be used to translate the digital signal (e.g., 0 to 1.2 v-2.5 v) to a 0 to 3.3 v signal. The 0 to 3.3 v signal may be sent to a high drive strength inverter (or driver) 138*a*-138*n* that drives the signal off chip. The inverters 138*a*-138*n* typically receive input voltage levels from off-chip having the same level as an output swing (e.g., 0 to 3.3 v). The inverters 138*a*-138*n* typically drive (or increase) the strength (e.g., current) of the signal. Along with an increased drive strength, the inverters may change the polarity (e.g., 3.3 v to 0 v). The levelshift may operate in an on chip to off chip path or in an offchip to onchip path. The particular voltages used are examples only. Other voltages may be used to meet the design criteria of a particular implementation.

Each of the IOs 130a-130n are configurable and may contain 100s-1000s of transistors that may or may not be used. Different level shifters 136a-136n may be implemented via metal changes (e.g., through metal programming). Different level shifters 136a-136n are needed in each of the IOs 130a-130n since a particular one of the level shifters 136a-136n is generally optimized for specific translation voltages. For example, the level shifter 136a may translate from 2.5 v to 3.3 v. The level shifter 136n may translate from 2.5 v to 1.2 v, etc. Each of the level shifters 136a-136n may be configured to translate from lower voltages to higher voltages, or from higher voltages to lower voltages.

Since each of the IOs 130a-130n is configurable, different sizes may be implemented for each of inverters 138a-138n. The inverters 138a-138n drive signals offchip for optimal power dissipation. For example, a certain design may need to drive a 50 ohm resistor in one case and a 5 Mohm resistor in another case. Clearly the 5 Mohm case may use a smaller inverter to optimize chip power consumption.

Multichip modules have several different pieces of silicon mounted in a package. Each piece of silicon may run off different supply voltages. The regulators and level shifters discussed may be used to alter the drive strengths of the various modules to optimize pincount, power consumption, and/or board complexity. For example, the entire package may use only 3.3 v. The regulators may then create lower voltages for the other silicon pieces (e.g., 2.5 v, 1.8 v, 1.5 v, 1.2 v, etc.). Similarly, if a clock signal is needed to go from a first module using a first supply, to a second module using a second (different) supply, level shifters may be used. When a particular clock is transferred, the clock may be made to drive the load of the other module (e.g., a large inverter or small inverter).

The voltage levels mentioned are used as examples. Other voltages may be implemented. The inverters described are a general description of an output section of an IO. Output sections may be implemented that may be more complicated than an inverter. The present invention may be implemented from signals moving on chip or off chip. Hence, the present invention may apply in either direction.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
  an integrated circuit having a plurality of regions each (i) pre-diffused and configured to be metal-programmed and (ii) configured to connect said integrated circuit to a socket; and
  a logic portion implemented on said integrated circuit, wherein said plurality of regions are each (i) independently programmable and (ii) located in one of said pre-diffused regions, and each of said plurality of regions comprises (a) a voltage regulator section configured to generate an operating voltage from a common supply voltage, (b) a logic section configured to implement integrated circuit functions and operate at said operating voltage, and (c) a level shifter configured to shift said operating voltage to an external voltage level and wherein said regions are pre-diffused during a first processing phase and configured during a second processing phase.

2. The apparatus according to claim 1, wherein a first of said voltage regulator sections generates a first operating voltage and a second of said voltage regulator sections generates a second operating voltage, wherein said first and second operating voltages are different.

3. The apparatus according to claim 1, wherein each of said regions further comprimises an inventor configured to drive a signal recieved from said level shifter to a strength expected by an external circuit.

4. The apparatus according to claim 1, wherein said regions are metal-programmed in different location around periphery of said intergrated circuit in response to a particular configuration of said socket.

5. The apparatus according to claim 1, wherein said first processing phase comprises a pre-inventory phase and second processing phase comprimises a completed inventory phase.

6. The apparatus according to claim 1, wherein one or more of said regions comprise built-in self test circuits.

7. The apparatus according to claim 1, wherein one or more of said regions comprise temperature compensation circuits.

8. The apparatus according to claim 1, wherein one or more of said regions comprise first order delta sigma modulator circuits.

9. The apparatus according to claim 1, wherein said integrated circuit comprises a plurality of dies configured as a multi-chip module.

10. The apparatus according to claim 1, wherein said common supply voltage is generated on a metal bus spanning each of said metal programmable regions.

11. The apparatus according to claim 1, wherein said apparatus comprises a plurality of supply voltages each generated from a metal bus, spanning each of said programmable regions.

12. The apparatus according to claim 1, wherein each of said metal programmable regions further comprises a device selected from the group consisting of transmitters, receivers and electrostatic discharge protection devices.

13. An apparatus comprising:
  a first integrated circuit having a plurality of regions each (i) pre-diffused and configured to be metal-programmed and (ii) configured to connect said integrated circuit to a second integrated circuit, wherein said first and said second integrated circuits are implemented on a multi-chip module; and
  a logic portion implemented on said integrated circuit, wherein said plurality of regions are each (i) independently programmable and (ii) located in one of said pre-diffused regions, and each of said plurality of regions comprises (a) a regulator section configured to generate an operating voltage from a common supply voltage, (b) a logic section configured to implement integrated circuit functions and operate at said operating voltage, and (c) a level shifter configured to shift said operating voltage to an external voltage level, wherein said metal programmable regions are pre-diffused during a first processing phase and configured during a second processing phase.

14. The apparatus according to claim 13, wherein each of said regions further comprises an inverter configured to drive a signal received from said level shifter to a strength expected by said second integrated circuit.

15. The apparatus according to claim 13, wherein said regions are metal-programmed in different locations around a periphery of said first integrated circuit in response to a particular configuration of said second integrated circuit.

16. The apparatus according to claim 13, wherein said first processing phase comprises a pre-inventory phase and said second processing phase comprises a completed-inventory phase.

17. The apparatus according to claim 13, wherein said first integrated circuit and said second integrated circuit each, comprise a plurality of dies configured as a multi-chip module.

18. The apparatus according to claim 13, wherein said apparatus comprises a plurality of supply voltages each generated from a metal bus, spanning each of said programmable regions.

* * * * *